United States Patent [19]

Tseng

[11] Patent Number: 5,736,459
[45] Date of Patent: Apr. 7, 1998

[54] METHOD TO FABRICATE A POLYSILICON STUD USING AN OXYGEN ION IMPLANTATION PROCEDURE

[75] Inventor: Horng-Huei Tseng, Hsinchu, Taiwan

[73] Assignee: Vanguard International Semiconductor Corporation

[21] Appl. No.: 856,778

[22] Filed: May 15, 1997

[51] Int. Cl.⁶ ................... H01L 21/283; H01L 21/3213
[52] U.S. Cl. ................... 438/629; 438/635; 438/647; 438/659; 438/766; 438/770
[58] Field of Search .................... 438/233, 629, 438/635, 647, 657, 659, 672, 766, 770, 624, 158, 351

[56] References Cited

U.S. PATENT DOCUMENTS

| | | | |
|---|---|---|---|
| 4,333,226 | 6/1982 | Abe et al. | 438/659 |
| 5,316,978 | 5/1994 | Boyd et al. | 437/203 |
| 5,378,652 | 1/1995 | Samata et al. | 438/647 |
| 5,534,460 | 7/1996 | Tseng et al. | 438/672 |
| 5,587,338 | 12/1996 | Tseng | 437/186 |
| 5,599,736 | 2/1997 | Tseng | 438/659 |

FOREIGN PATENT DOCUMENTS

| | | | |
|---|---|---|---|
| 62-235754 | 10/1987 | Japan | 438/158 |
| 1-111354 | 4/1989 | Japan. | |
| 4-79327 | 3/1992 | Japan. | |

*Primary Examiner*—T. N. Quach
*Attorney, Agent, or Firm*—George O. Saile; Stephen B. Ackerman

[57] ABSTRACT

A process for creating a MOSFET device, using a polysilicon contact stud, in a sub-micron diameter contact hole, used to interconnect an underlying active device region, in a semiconductor substrate, and an overlying metal structure, has been developed. The process features depositing a polysilicon layer, to fill a sub-micron diameter contact hole, followed by an oxygen ion implantation procedure, into regions of polysilicon that are not used for the contact stud. A subsequent anneal procedure converts the oxygen implanted regions of the polysilicon layer to a silicon oxide layer. Removal of the silicon oxide layer leaves a polysilicon contact stud, in the sub-micron diameter contact hole.

19 Claims, 4 Drawing Sheets

METHOD TO FABRICATE A POLYSILICON STUD USING AN OXYGEN ION IMPLANTATION PROCEDURE

Related Patent Application—"POLYSILICON CONTACT STUD PROCESS", by H. H. Tseng, of Vanguard International Semiconductor Corporation. U.S. Pat. No. 5,587,338, Ser. No. 08/428,493, (Dec. 24, 1996), assigned to a common assignee.

BACKGROUND OF THE INVENTION (1) Field of the Invention

The present invention relates to processes used to fabricate semiconductor devices, and more specifically to a procedure used to create a polysilicon contact stud for a metal oxide semiconductor field effect transistor, (MOSFET), device.

(2) Description of Prior Art

The semiconductor industry is continually striving to improve the performance of semiconductor devices, while still attempting to maintain, or even to reduce, the cost of manufacturing these devices. The trend to micro-miniaturization, or the ability to create semiconductor devices with sub-micron features, has allowed the performance and cost objectives to be partially realized. The smaller device features result in reductions of performance degrading capacitances and resistances, thus resulting in performance increases. In addition smaller features allow smaller semiconductor chips to be realized, allowing more chips to be obtained from a specific size starting substrate, thus reducing the possessing costs for a specific semiconductor chip.

Specific semiconductor disciplines, such as photolithography and reactive ion etching, (RIE), have been paramount in the quest to create semiconductor devices featuring sub-micron dimensions. The use of more sophisticated exposure cameras, as well as the use of more sensitive photoresist materials, have allowed sub-micron images in photoresist layers, to be routinely obtained. In addition the use of more advanced dry etching tools and processes, have allowed the sub-micron images in overlying photoresist layers to be successfully transferred to underlying materials, used for the fabrication of semiconductor devices. However in addition to the contributions of semiconductor fabrication disciplines, structural innovations are still needed to continue the journey to micro-miniaturization. For example contact studs, used to connect an overlying interconnect metallization level, to an underlying region of the active semiconductor device, have been used to reduce the area needed for contact to source and drain regions. Sub-micron diameter contact holes, filled with a conductive stud material, have replaced wider counterpart holes, where one conductive material, such as aluminum, was used to both fill the wider contact holes, as well as to supply the material for the interconnecting metallization structure. The use of sub-micron diameter contact holes creates difficulties when attempting to fill with conventional interconnect metallization candidates, such as aluminum. Therefore the semiconductor industry has been attempting to fill the sub-micron diameter contact hole with conductive materials, that can be chemically vapor deposited, such as polysilicon, followed by removal of the polysilicon from all regions, except the contact hole, creating a polysilicon stud, filling the sub-micron contact hole. Subsequent interconnect metallization levels, are next created on planar surfaces, overlying the polysilicon contact stud.

Prior art, such as Boyd, et al, in U.S. Pat. No. 5,316,978, describe the creation of a polysilicon stud, in a contact hole, however that invention uses a complex and costly, chemical mechanical procedure to remove unwanted polysilicon from regions other then the contact hole. This invention will describe a process for creating a polysilicon stud, in a sub-micron diameter contact hole, in which the unwanted polysilicon is converted to a silicon oxide layer, via use of an oxygen ion implantation procedure into the unwanted polysilicon layer. An anneal procedure is then used to convert the oxygen implanted, unwanted polysilicon layer to a silicon oxide layer, followed by removal of the silicon oxide layer, leaving a polysilicon stud, in the sub-micron diameter contact hole.

SUMMARY OF THE INVENTION

It is an object of this invention to create a MOSFET device structure, using a polysilicon contact stud, in a sub-micron diameter contact hole, to connect an overlying interconnect metallization structure to an active device region in the semiconductor substrate.

It is another object of this invention to form the polysilicon contact stud, by deposition of a polysilicon layer, and removing unwanted polysilicon, from regions other then from inside the sub-micron diameter contact hole.

It is still another object of this invention to remove unwanted polysilicon regions by initially ion implanting the unwanted polysilicon regions with oxygen, then annealing to convert to the oxygen implanted polysilicon regions to a silicon oxide layer, and selectively removing the silicon oxide layer.

In accordance with the present invention a process is described for creating a polysilicon contact stud, in a sub-micron diameter contact hole, to make contact to an underlying source and drain region of a MOSFET device. An insulator layer is deposited on the active region of a MOSFET device, followed by the opening of a sub-micron diameter contact hole, in the insulator layer, exposing a source and drain region of the MOSFET device. A polysilicon layer is deposited completing filling the sub-micron diameter contact hole, also overlying the top surface of the insulator layer. An oxygen ion implantation is used to place oxygen in the regions of polysilicon that are not used for the polysilicon contact stud. An anneal is then performed to convert the oxygen implanted polysilicon region to a silicon oxide layer. The silicon oxide layer is then selectively removed from the top surface of the insulator layer, as well as from the top surface of the polysilicon contact stud, in the sub-micron diameter contact hole.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming a MOSFET device, with a polysilicon contact stud, in a sub-micron diameter contact hole, will now be described in detail. In this invention the polysilicon contact stud will be used with a N type, MOSFET device. However the use of a polysilicon contact stud can also be applied to a P type, MOSFET device, to complimentary, (CMOS), devices, and to BiCMOS devices.

Figure 1:
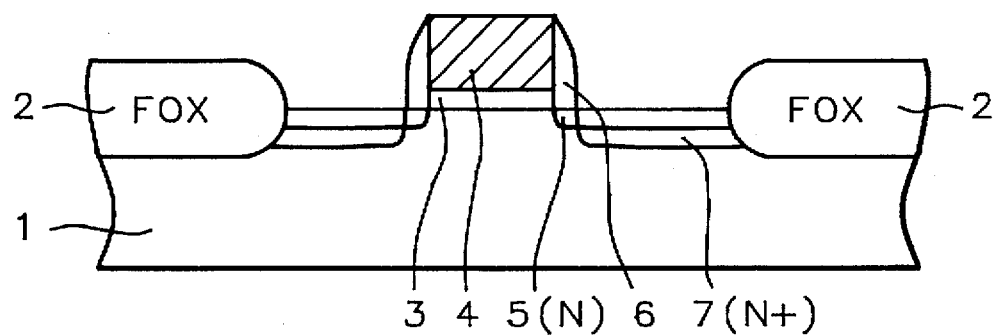
FIGS. 1–7, which schematically, in cross-sectional style, describe the key stages of fabrication used to create a MOSFET device featuring a polysilicon contact stud, in a sub-micron diameter contact hole.

Referring to FIG. 1, a P type, semiconductor substrate 1, with a <100>, single crystalline orientation, is used. Field oxide, (FOX), regions 2, are used for purposes of isolation. Briefly the FOX regions 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions 2, from growing on areas of substrate 1, to be used for subsequent device regions. After the growth of the FOX regions 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer 3, of silicon oxide is thermally grown in an oxygen-steam ambient, at a temperature between about 850° to 1050° C., to a thickness between about 50 to 200 Angstroms. A polysilicon layer is next deposited using low pressure chemical vapor deposition, (LPCVD), procedures, at a temperature between about 500° to 700° C., to a thickness between about 1500 to 4000 Angstroms. The polysilicon layer can either be grown intrinsically, and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the sitane ambient. Conventional photolithographic and reactive ion etching, (RIE), procedures, using Cl$_2$ as an etchant, are used to pattern the polysilicon layer, creating polysilicon gate structure 4, shown schematically in FIG. 1. Photoresist removal is accomplished via plasma oxygen ashing and careful wet cleans.

Figure 2:
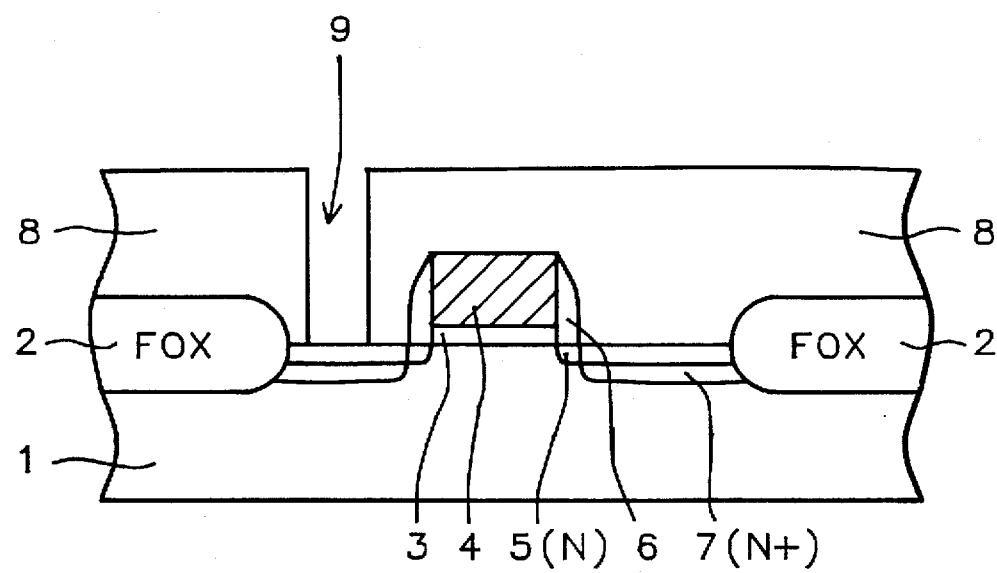

A lightly doped source and drain region 5, is next formed via ion implantation of phosphorous, at an energy between about 20 to 50 KeV, at a dose between about 1E13 to 1E14 atoms/cm$^2$. A layer of silicon oxide is then deposited using either LPCVD or PECVD procedures, at a temperature between about 400° to 700° C., to a thickness between about 1500 to 4000 Angstroms, followed by an anisotropic RIE procedure, using CHF$_3$ as an etchant, creating insulator spacer 6, on the sidewalls of polysilicon gate structure 4. A heavily doped source and drain region 7, is then formed via ion implantation of arsenic, at an energy between about 30 to 80 KeV, at a dose between about 1E15 to 1E16 atoms/cm$^2$. The result of these procedures are schematically shown in FIG. 2.

A first insulator layer of silicon oxide 8, is next deposited using LPCVD or PECVD procedures, at a temperature between about 400° to 700° C., to a thickness between about 4000 to 6000 Angstroms. First insulator layer 8, can also be a composite insulator layer, comprised of an underlying silicon oxide layer, at a thickness between about 3000 to 5000 Angstroms, and an overlying silicon nitride layer, at a thickness between about 500 to 1000 Angstroms. Conventional photolithographic and RIE procedures, using CHF$_3$ as an etchant, are used to open contact hole, 9, in first insulator layer 8, exposing the top surface of heavily doped source and drain region, 7. If the composite insulator layer is used as the first insulator layer, the RIE procedure will be comprised of the use of Cl$_2$ as an etchant for silicon nitride, and again CHF$_3$ used as an etchant for the underlying silicon oxide layer. Photoresist removal is performed via use of plasma oxygen ashing and careful wet cleans. Contact hole 9, schematically shown in FIG. 2, has a diameter between about 0.3 to 0.50 uM, resulting in a deep sub-micron diameter contact hole, with a high aspect ratio, making it difficult to fill with a conductive material that is not deposited using chemical vapor deposition procedures.

Figure 3:
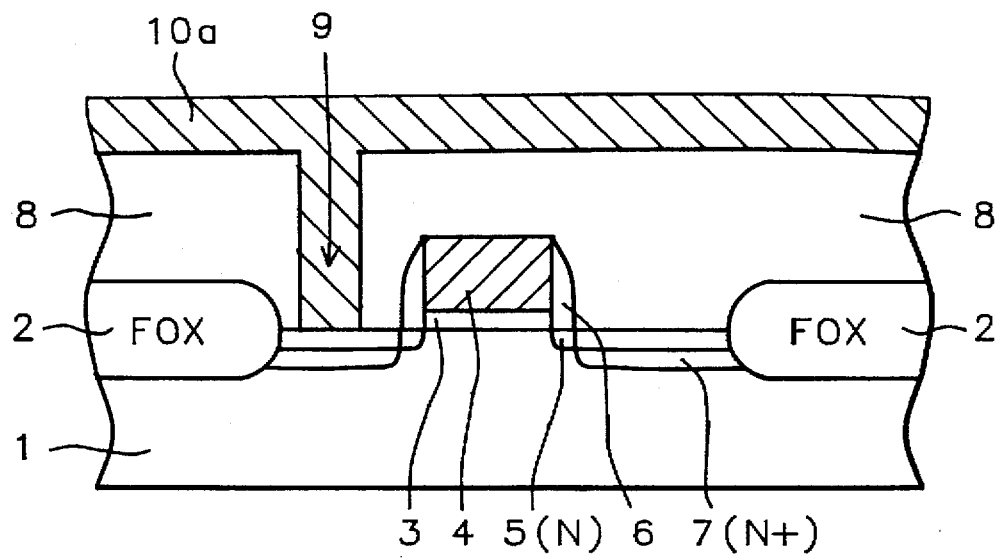

FIG. 3, schematically shows the filling of contact hole 9, with polysilicon layer 10a. A pre-clean, using a buffered hydrofluoric acid solution, is used to remove any native oxide that may have formed on the surface of heavily doped source and drain region 7, exposed in contact hole 9. Polysilicon layer 10a, is next deposited using LPCVD procedures, at a temperature between about 500° to 700° C., to a thickness between about 800 to 3000 Angstroms, resulting in complete filling of contact hole 9, including deposition of polysilicon layer 10a, on the top surface of first insulator layer 8. Polysilicon layer 8, can be deposited intrinsically and doped via ion implantation procedures, using arsenic or phosphorous as the implanted species, or polysilicon layer 10a, can be deposited using in situ doping procedures by the addition of either phosphine, or arsine, to the silane ambient.

Figure 4:
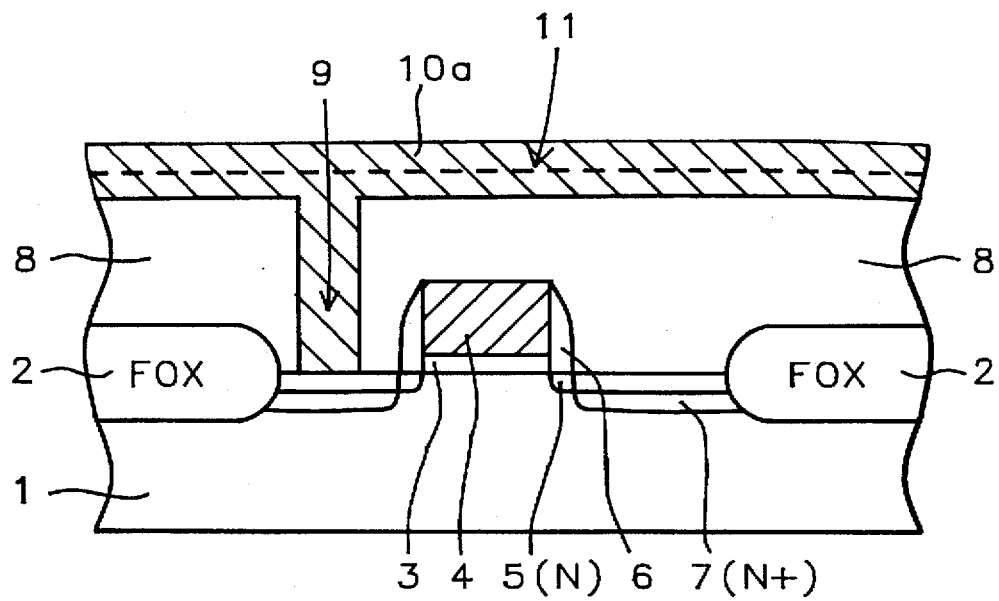
Figure 5:
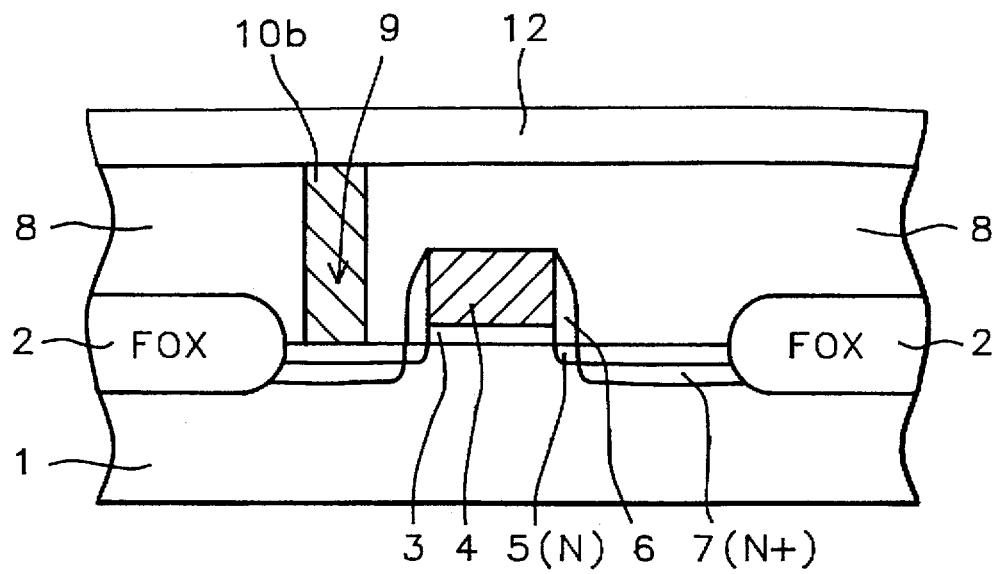

An ion implantation procedure is next performed, placing oxygen ions 11, in the top portion of polysilicon layer 10a. This is schematically shown in FIG. 4. The implantation procedure places oxygen ions 11, in the top portion of the polysilicon layer 10a, that resides on the top surface of first insulator layer 8, as well as placing oxygen ions in the top portion of the polysilicon layer 10a, that resides on the polysilicon filled contact hole 9. A critical anneal procedure, performed using a conventional furnace, or a rapid thermal anneal procedure, is used to convert the entire top portion of polysilicon layer 10a, containing implanted oxygen ions 11, and residing on the top surface of first insulator layer 8, to a silicon oxide layer 12. The top portion of polysilicon layer 12a, containing oxygen ions, and residing on the polysilicon filled contact hole 9, is also converted to silicon oxide layer 12, leaving polysilicon contact stud 10b, in sub-micron diameter contact hole 9. This is schematically shown in FIG. 5.

Figure 6:
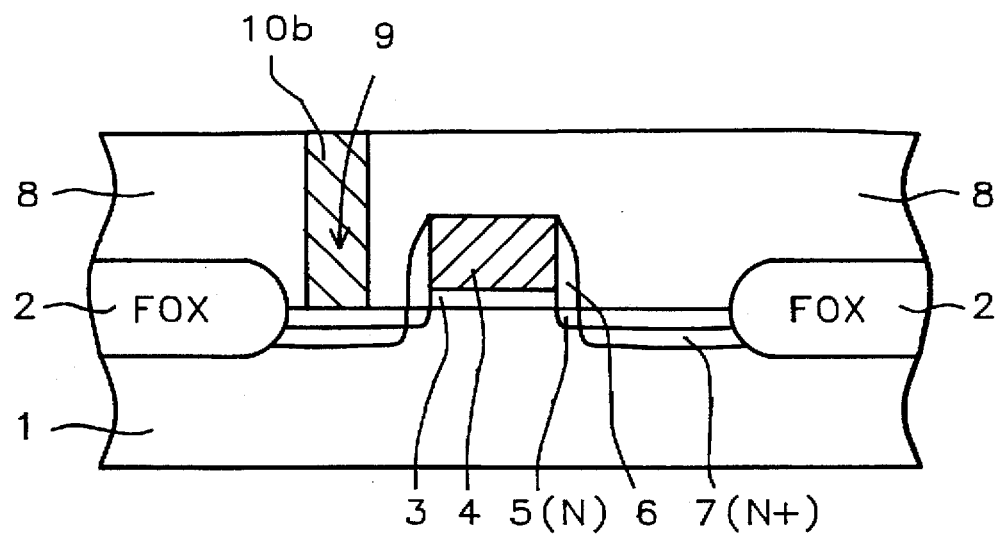

FIG. 6, schematically shows the MOSFET structure, after removal of silicon oxide layer 12. Silicon oxide layer 12, is selectively removed from the top surface of first insulator layer 8, and from the top surface of polysilicon contact stud 10b. The use of a buffered hydrofluoric acid solution removes silicon oxide layer 12, without attacking the silicon nitride layer, of the composite, first insulator layer 8, comprised of a silicon nitride layer overlying a silicon oxide layer. Selective removal of silicon oxide layer 12, can also be accomplished using hydrofluoric acid vapors or plasma etching, using CHF$_3$ as an etchant.

Figure 7:
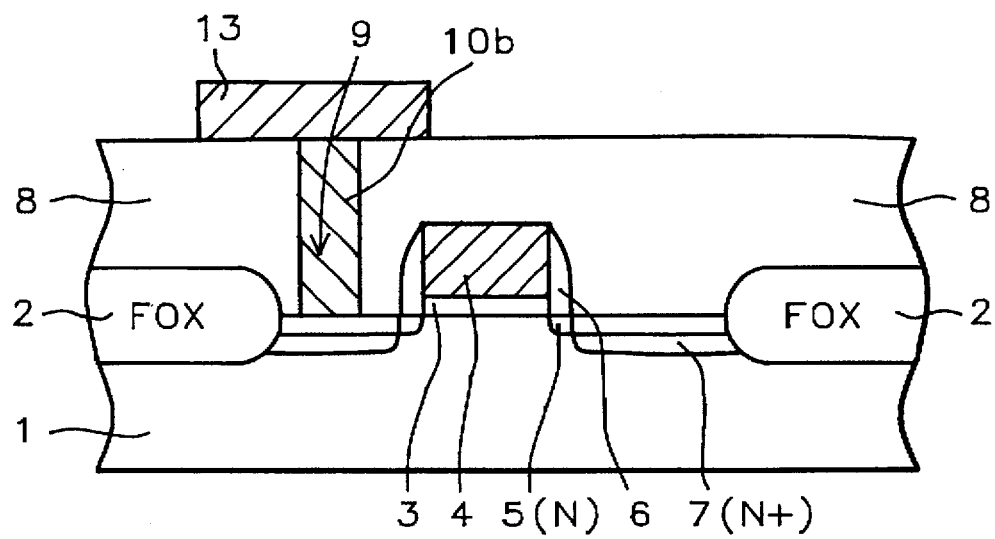

FIG. 7, schematically describes the metal interconnect structure 13, overlying polysilicon contact stud 10b. After a pre-clean treatment, an aluminum based layer is deposited, via r.f. sputtering, to a thickness between about 3000 to 8000 Angstroms. The aluminum based layer contains between about 0 to 3% copper, and between about 0 to 1% silicon. Conventional photolithographic and RIE procedures, using Cl$_2$ as an etchant, are used for patterning the aluminum based layer, creating metal interconnect structure 13. Metal interconnect structure 13, can also be formed from other metallization layers, such as tungsten. Photoresist removal is performed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a MOSFET device on a semiconductor substrate using a conductive stud to provide electrical contact between an active device region, in the substrate, and an overlying metal interconnect structure, comprising the steps of:

providing said active device region, in said semiconductor substrate;

depositing a first insulator layer on said semiconductor substrate, including deposition on said active device region;

opening a contact hole in said first insulator layer, exposing top surface of said active device region, in said semiconductor substrate;

depositing a conductive layer on top surface of said first insulator layer, and completely filling said contact hole;

ion implanting oxygen ions into a region of said conductive layer that overlays the top surface of said first insulator layer, and overlays said conductive layer in said contact hole, creating a region of an oxygen containing conductive layer;

annealing to completely convert said oxygen containing conductive layer, to a second insulator layer, leaving said conductive layer, in said contact hole, unconverted;

removing said second insulator layer, leaving said conductive stud in said contact hole; and creating a interconnect metal structure, contacting the top surface of said conductive stud.

2. The method of claim 1, wherein said active device region, in said semiconductor substrate, is a heavily doped, N type, or P type, source and drain region.

3. The method of claim 1, wherein said first insulator layer is silicon oxide, deposited using LPCVD or PECVD procedures, at a temperature between about 400° to 700° C., to a thickness between about 4000 to 6000 Angstroms.

4. The method of claim 1, wherein said first insulator layer is a composite layer, comprised of an overlying silicon nitride layer, deposited using LPCVD or PECVD procedures, to a thickness between about 500 to 1000 Angstroms, and an underlying silicon oxide layer, deposited using LPCVD or PECVD procedures, to a thickness between about 3000 to 5000 Angstroms.

5. The method of claim 1, wherein said contact hole, in said first insulator layer, is opened using anisotropic RIE procedures, using $Cl_2$ and $CHF_3$ as etchants.

6. The method of claim 1, wherein said contact hole has a diameter between about 0.3 to 0.5 μM.

7. The method of claim 1, wherein said conductive layer is an intrinsic polysilicon layer, deposited using LPCVD procedures, at a temperature between 500° to 700° C., to a thickness between about 800 to 3000 Angstroms, and doped via ion implantation of phosphorous or arsenic.

8. The method of claim 1, wherein said conductive layer is an in situ doped polysilicon layer, deposited using LPCVD procedures, at a temperature between about 500° to 700° C., to a thickness between about 800 to 3000, using either phosphine, or arsine, in a silane ambient.

9. The method of claim 1, wherein said anneal, used to convert said oxygen containing conductive layer, to a second insulator layer, is performed using a furnace, or the anneal is performed using a rapid thermal anneal procedure.

10. The method of claim 1, wherein removal of said second insulator layer is accomplished using any of a wet buffered hydrofluoric acid solution, or using dry hydrofluoric acid vapors, or via use of plasma etching, using $CHF_3$ as an etchant.

11. A method of fabricating a MOSFET device, on a semiconductor substrate, using a polysilicon contact stud, in a sub-micron diameter contact hole, to provide the connection between an active device region, in said semiconductor substrate, exposed in bottom of said sub-micron diameter contact hole, and an overlying metal interconnect structure, comprising the steps of:

providing a source and drain region in said MOSFET device;

depositing a composite insulator layer on said semiconductor substrate, including deposition of said composite insulator layer on said source and drain region;

opening said sub-micron diameter contact hole, in said composite insulator layer, exposing a portion of top surface of said source and drain region;

depositing a polysilicon layer, completely filling said sub-micron diameter contact hole, and overlying top surface of said composite insulator layer;

ion implanting oxygen ions into a top region of said polysilicon layer that overlies polysilicon filled contact hole, and overlies the top surface of said composite insulator layer, creating an oxygen implanted polysilicon layer;

annealing to convert said oxygen implanted polysilicon layer, to a silicon oxide layer, while leaving unimplanted, polysilicon layer, in said sub-micron diameter contact hole, unconverted;

removing said silicon oxide layer from top surface of said composite insulator layer, and from top surface of said polysilicon layer, in said sub-micron diameter contact hole, leaving said polysilicon contact stud, in said sub-micron diameter contact hole;

forming a metal interconnect structure, contacting top surface of said polysilicon contact stud, and overlying top surface of said composite insulator layer.

12. The method of claim 11, wherein said source and drain region is a heavily doped N type, or heavily doped P type region.

13. The method of claim 11, wherein said composite insulator layer is comprised of an underlying layer of silicon oxide, deposited using LPCVD or PECVD procedures, to a thickness between about 3000 to 5000 Angstroms, and an overlying silicon nitride layer, deposited using LPCVD or PECVD procedures, to a thickness between about 500 to 1000 Angstroms.

14. The method of claim 11, wherein said sub-micron diameter contact hole, in said composite insulator layer, is created via anisotropic RIE procedures, using $Cl_2$ as an etchant for the silicon nitride layer, while using $CHF_3$ as an etchant for the silicon oxide layer.

15. The method of claim 11, wherein said sub-micron diameter contact hole, in said composite insulator layer, has a diameter between about 0.3 to 0.5 μM.

16. The method of claim 11, wherein said polysilicon layer is deposited using LPCVD procedures, at a temperature between about 500° to 700° C., to a thickness between about 800 to 3000 Angstroms, and doped using ion implantation of either arsenic or phosphorous.

17. The method of claim 11, wherein said polysilicon layer is deposited using an in situ doping, LPCVD procedure, at a temperature between about 500° to 700° C., to a thickness between about 800 to 3000 Angstroms, by addition of either phosphine or arsine, to a silane ambient.

18. The method of claim 11, wherein said anneal, used to convert oxygen containing, top portion of said polysilicon layer, to a silicon oxide layer, is performed using a furnace procedure, or performed using a rapid thermal anneal procedure.

19. The method of claim 11, wherein said silicon oxide layer, on top surface of said composite insulator layer, and on said top surface of said polysilicon contact stud, is removed using any of a buffered hydrofluoric acid solution, or dry hydrofluoric acid vapors, or plasma etching, using $CHF_3$ as an etchant.

* * * * *